United States Patent
Zhang et al.

(10) Patent No.: US 10,692,965 B2
(45) Date of Patent: Jun. 23, 2020

(54) 3D CONDUCTIVE INK PRINTING METHOD AND INDUCTOR FORMED THEREOF

(71) Applicant: Intel Corporation, Santa Clara, CA (US)

(72) Inventors: Chong Zhang, Chandler, AZ (US); Andrew J. Brown, Phoenix, AZ (US); Sheng Li, Gilbert, AZ (US); Sai Vadlamani, Chandler, AZ (US); Ying Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/142,817

(22) Filed: Sep. 26, 2018

(65) Prior Publication Data
US 2020/0098848 A1 Mar. 26, 2020

(51) Int. Cl.
| | |
|---|---|
| *H01L 27/08* | (2006.01) |
| *H01L 49/02* | (2006.01) |
| *H01F 27/28* | (2006.01) |
| *C09D 11/52* | (2014.01) |
| *H01L 23/522* | (2006.01) |
| *G05F 1/625* | (2006.01) |

(52) U.S. Cl.
CPC ........... *H01L 28/10* (2013.01); *C09D 11/52* (2013.01); *G05F 1/625* (2013.01); *H01F 27/2804* (2013.01); *H01L 23/5227* (2013.01)

(58) Field of Classification Search
CPC ..... H01L 23/5227; H01L 28/10; C09D 11/52; G05F 1/10; G05F 1/625; H01F 27/24; H01F 27/2804; H01F 27/327; H01F 41/0206
USPC ................................................ 438/3; 257/531
See application file for complete search history.

(56) References Cited

U.S. PATENT DOCUMENTS

| | | | |
|---|---|---|---|
| 2019/0272936 A1* | 9/2019 | Zhang | H01F 41/0206 |
| 2020/0006464 A1* | 1/2020 | Brown | H01L 23/5227 |

* cited by examiner

*Primary Examiner* — Brook Kebede
(74) *Attorney, Agent, or Firm* — Schwegman Lundberg & Woessner, P.A.

(57) ABSTRACT

Methods of forming an inductor using dry processes are described. A cavity is laser drilled in an insulator. A first magnetic material layer is printed in the cavity. An Ag conductive ink is printed on the first magnetic material layer and a second magnetic material layer printed on the ink. The ink has a trace sandwiched between the first and second magnetic material layers that provides a majority of the inductance of the inductor. A protective insulating layer protects the second magnetic material layer from a wet chemistry solution when contacts are formed to the ink. The second magnetic material layer and ink are deposited in or on the cavity.

11 Claims, 14 Drawing Sheets

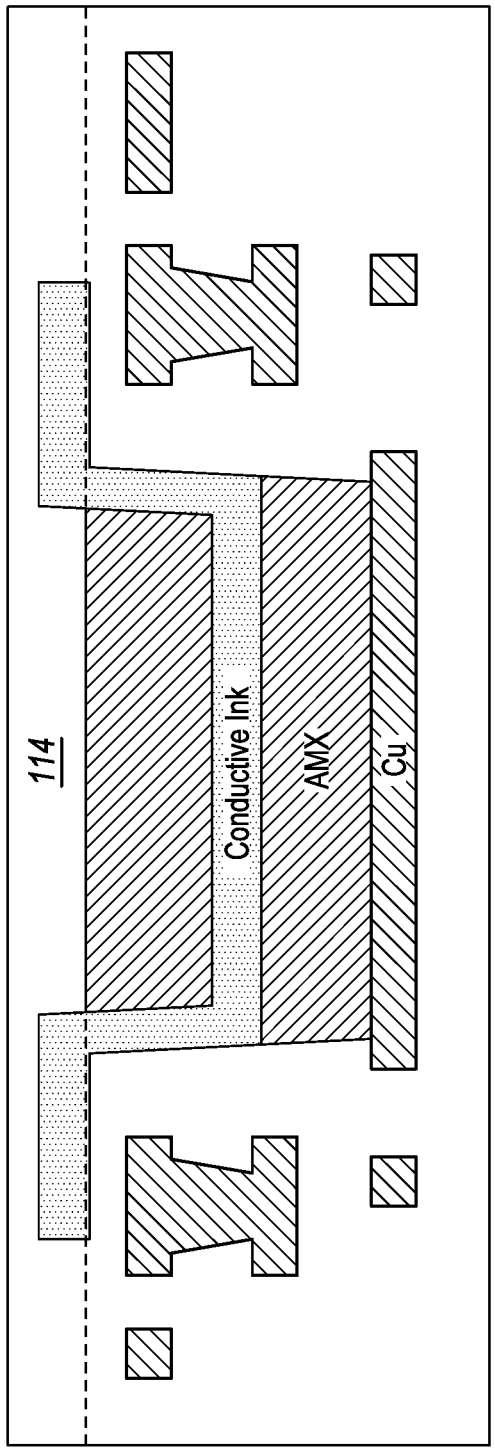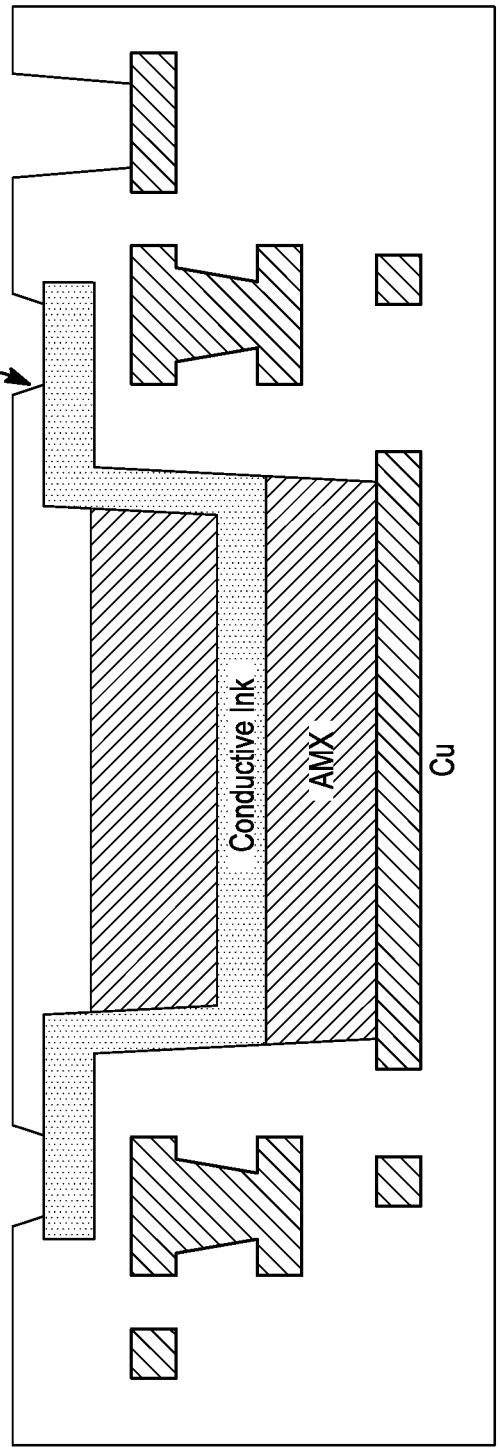

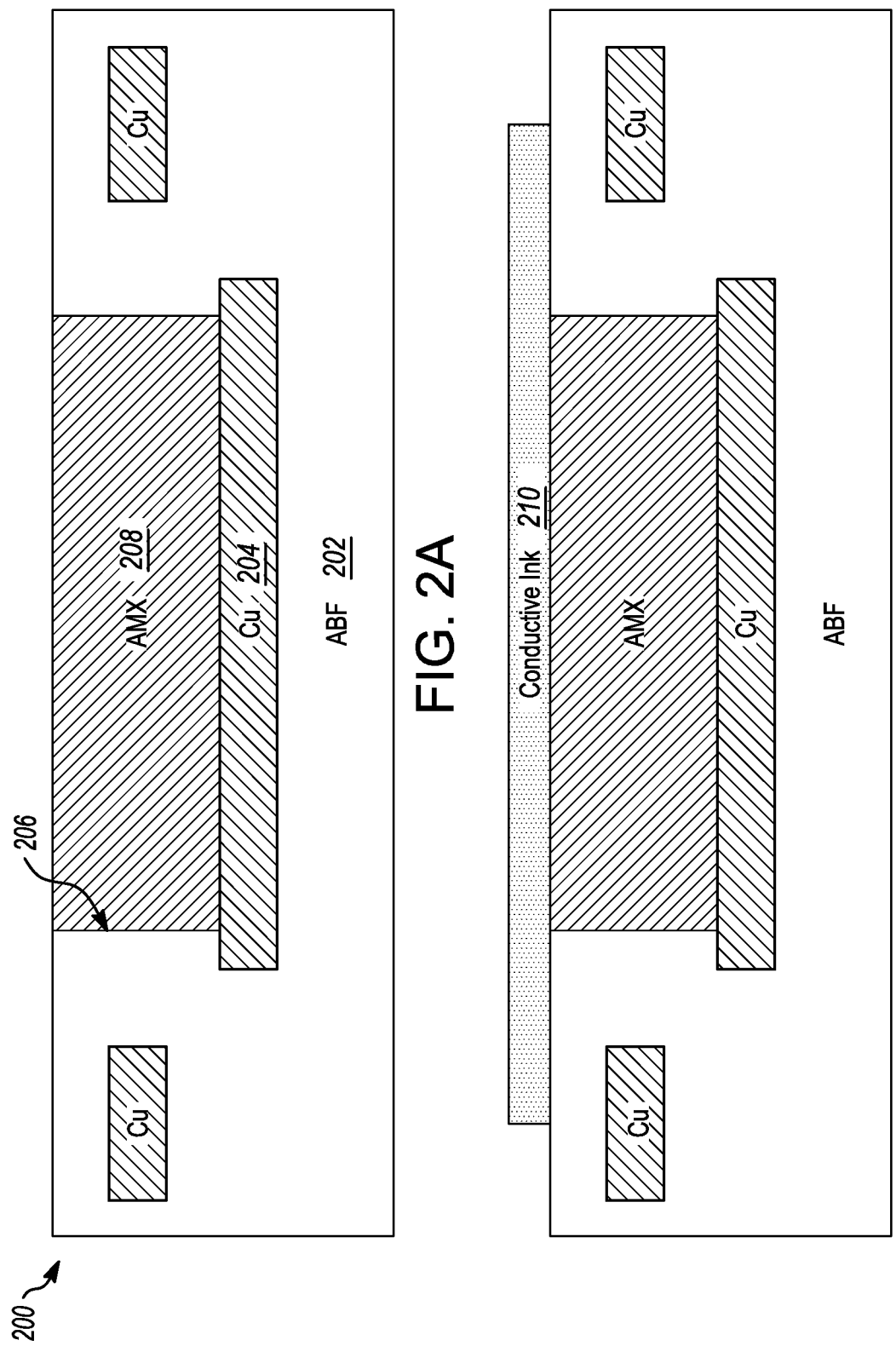

3D CONDUCTIVE INK PRINTING METHOD AND INDUCTOR FORMED THEREOF

TECHNICAL FIELD

This disclosure relates generally to electronic devices and fabrication thereof. Some embodiments are related to inductor fabrication. Some embodiments are related to printing of conductive ink on a magnetic material to create an inductor.

BACKGROUND

Electronic devices continue to permeate every aspect of daily life. Among the many types of electronic devices, smartphones and other electronic communication devices that rely on microelectronics continue to grow, as does the desire for increased processing power. The complexity and density of the circuitry also continues to grow. This is problematic for a number of reasons that include operational issues such as problems with power dissipation and delivery, structural issues such as thickness issues as the number of layers increases, and concomitant manufacturing issues.

BRIEF DESCRIPTION OF THE DRAWINGS

FIGS. 1A-1J illustrate a method of printing 3D conductive ink in accordance with some embodiments.

FIGS. 2A-2H illustrate a method of printing 3D conductive ink in accordance with some embodiments.

DESCRIPTION OF EMBODIMENTS

Figure 1A:
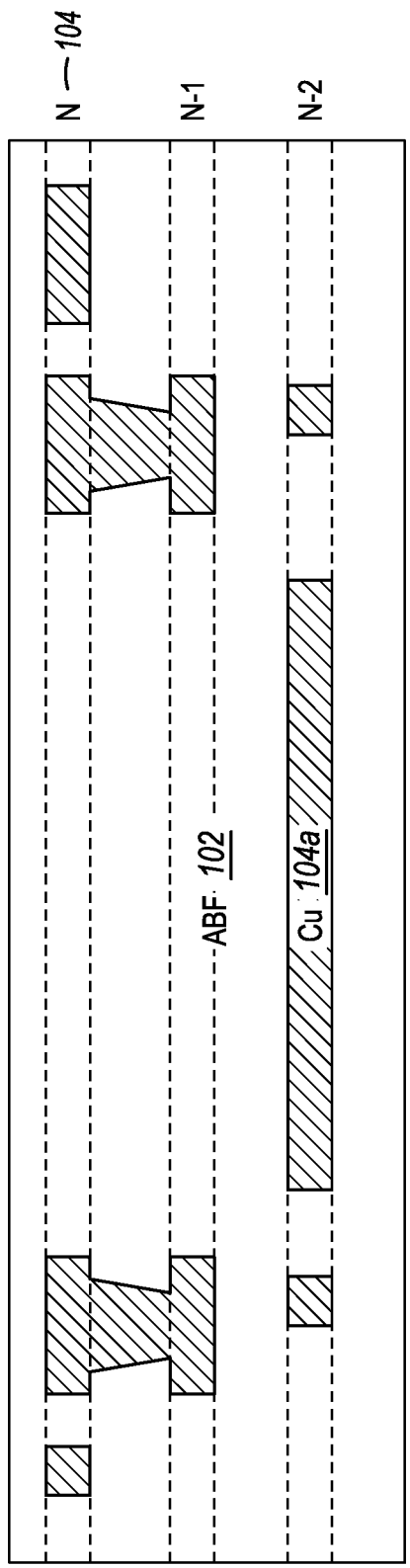

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation. In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an ASIC, an electronic circuit, a SOC, a processor (shared, dedicated, or group), and/or memory (shared, dedicated, or group) that execute one or more software or firmware programs, a combinational logic circuit, and/or other suitable components that provide the described functionality.

As above, a number of complexities abound when designing next generation electronics. For example, a continual desire for package size reductions have led to the development of coreless technology, which is about ⅓ as thick as a conventional substrate in the z-direction and has itself led to issues with substrate warpage and attendant assembly yield. In another example, the processing speeds and power used for next generation electronics are likely to continue to increase, causing a number of power-related constraints. One such issue arises from the use of an integrated voltage regulator, which may be included on a die as a part of a processing core for power delivery from an external power supply. A voltage regulator may use relatively large passive components such as inductors and capacitors that are disposed external to the die and connected through vias or other connectors. However, increasing the size of the passive components or extending the distance from other circuitry may increase the Q factors of the passive components as well as decreasing the performance of the passive components.

To improve the characteristics of a voltage regulator, for example a Fully Integrated Voltage Regulator (FIVR), it may be desirable to form the passive components closer to the components connected to the regulator. These components, such as I/O circuitry or power control, may be formed on a separate die package from the FIVR. The inductor of the FIVR may present a particular size constraint. However, fabricating the inductor on the die package may complicate construction of the die and increase the die package size in the thickness direction.

An alternate solution to improve the efficiency of the FIVR may be the incorporation of magnetic materials in a substrate to create magnetic inductors within the substrate. The substrate used may be coreless or may contain a core, such as an organic or ceramic material. Example organic cores may include materials such as bismaleimide-triazine (BT) or FR4 resin. One advantage of such an integrated inductor is that the use of discrete inductor components on the land side of the die package may be avoided. This may simultaneously reduce the voltage droop and also reduce the height.

To fabricate an integrated inductor, a magnetic paste may be used in the coreless substrate to create in-package inductors that meet the desired FIVR efficiency. However, the magnetic materials used to form the magnetic paste may be prone to severe leaching in wet chemistry baths (both acidic and alkaline) used during processing of the inductor. This leaching is expected to reduce the bath life and also the efficiency of both the desmear process to roughen the surface of the substrate and the deposition rate in an electroless (e-less) Cu process.

Avoiding wet processes such as desmear and e-less copper deposition to circumvent the problem is in some cases not feasible, while reformulating the materials, even if able to retain the desired magnetic properties, is unlikely to mitigate the leaching entirely. In embodiments in which the magnetic material is deposited in the first layer on top of the inductor trace, the magnetic material contacts the desmear and e-less solution, leading to the above issues. In embodiments in which the magnetic material avoids contacting the desmear and e-less solution by depositing the magnetic material on the bottom layer of the substrate, the distance of the inductor from the die load is increased, increasing parasitic capacitance and inductance of the circuitry, which reduces performance of the FIVR or other circuitry using the inductor.

In some embodiments, a 3D conductive ink may be printed on the magnetic material rather than using a wet plating process to deposit the conductive layers. The use of a 3D conductive ink mitigates leaching as there is no interaction between the magnetic material and the desmear and e-less chemistry processes. This may permit the magnetic inductor to be disposed in any layer, improving both design flexibility and improving performance of the FIVR (or other circuit) by enabling the magnetic inductor to be placed closer to the load on the die package.

FIGS. 1A-1J illustrate a method of printing 3D conductive ink in accordance with some embodiments. The processes shown in FIGS. 1A-1J, which primarily show cross-sectional areas of different steps of the overall method, may be used to create an inductor for a FIVR or other regulator or other circuitry in which an inductor is to be used. The method of FIGS. 1A-1J may exclusively use a dry 3D printing process to deposit the layers of magnetic material and conductive ink rather than using one or more wet chemical processes during these steps.

FIG. 1A illustrates a substrate 100 containing multiple insulating and conductive layers 102, 104. The substrate 100 may be a coreless substrate or may contain an organic or semiconductor base (not shown) on which the conductive layers 104 are deposited. The insulating layers 102 may be formed from one or more types of organic material, such as an epoxy based dielectric, oxide or nitride. The conductive layers 104 may be formed from one or more metals, such as Cu, Ni, Au or Ag, among others. Each of the conductive layers 104 deposited by techniques such electroplating, e-less plating, physical vapor deposition (PVD) such as sputtering, chemical vapor deposition (CVD), or evaporation. Each of the insulating and conductive layers 102, 104 may be further processed after deposition, such as being planarized or being subject to a laser drilling process to form vias or other connections between one or more of the conductive layers 104.

As above, FIG. 1A shows that multiple conductive (metal) layers 102 have been formed in the substrate 100. The metal layers are shown as layer N, N-1 and N-2, indicating increasing distance from the surface of the substrate 100. Other metal layers may be present but are not shown for convenience. The metal layers 102 may be formed from Cu, for example. The substrate 100 contains a dielectric film 102 laminated on the N metal layer 104 closest to the surface of the substrate 100. As shown in FIG. 1A, a Cu stage 104a may be located in the N-2 metal layer. The Cu stage 104a may be used as a laser stopper for a subsequently-formed cavity.

Figure 1B:
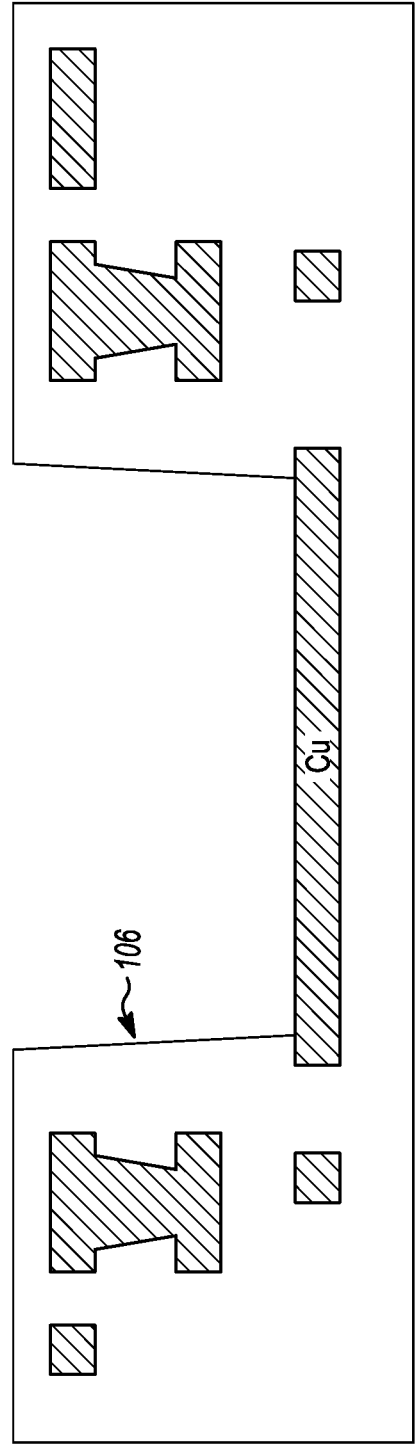

FIG. 1B shows a cross-sectional area after formation of the cavity 106. In some embodiments, a UV laser, $CO_2$ laser, or other laser may be used to form the cavity 106. The cavity 106 may be relatively deep, in some embodiments, about 95 µm, and thus a high power layer as a Cu direct laser tool may be used to form the cavity 106. Due to the depth of the cavity 106, the cavity 106 may be created in multiple passes of the laser. Formation of the cavity 106 may be followed by a desmearing process, such as applying a permanganate solution to remove residential material (smear) in the cavity 106 left by the laser etching.

Figure 1C:
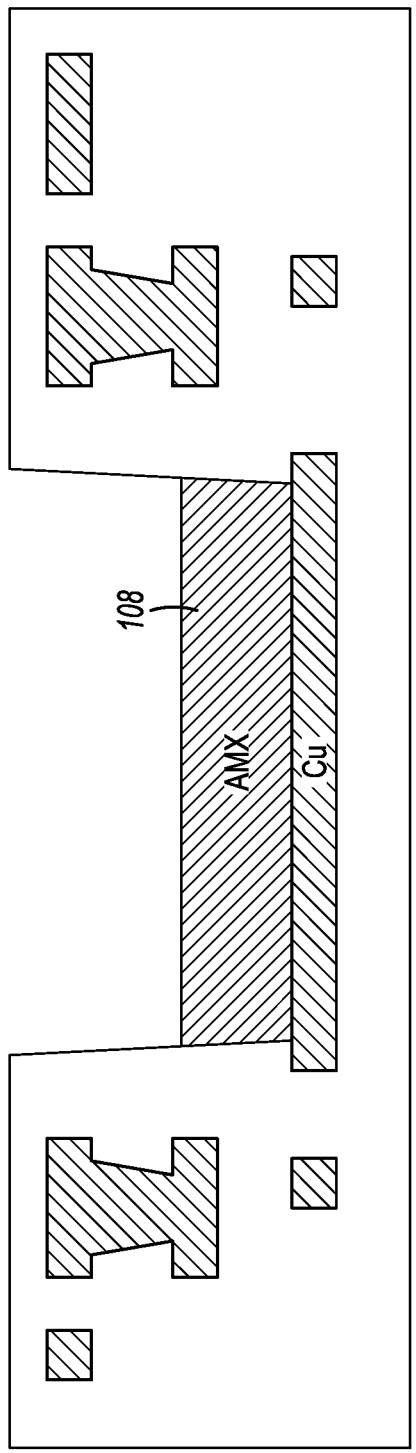

The cavity 106 may be used to retain material to form the inductor. Specifically, as shown in FIG. 1C, after formation of the cavity 106, magnetic material 108 such as ferrite filler based organic paste may be printed using a 3D printer or screen printer inside the cavity 106. In some embodiments, the printing dimensions of the magnetic material 108 may be limited to the cavity 106. By controlling the printing parameters, the cavity 106 may be only partially filled by the magnetic material 108. In some embodiments, if the cavity 106 is about 95 µm, the magnetic material 108 may fill about the lowermost 40 µm.

In some embodiments, the top surface of the magnetic material 108 in the cavity 106 may be somewhat uneven. This may be of less concern for printing of conductive ink compared with other types of semiconductor fabrication techniques, however. To reduce the unevenness, in some embodiments, the top surface of the magnetic material 108 inside the cavity 106 may be roughly flattened by a tool such as a rubber press may be introduced to flatten the magnetic material 108.

After the magnetic material 108 is printed in the cavity 106, conductive ink 110 may be printed on the structure using the 3D or screen printer. The conductive ink 110 may contain an organic solvent in which one or more types of conductive particles (e.g., of 3-10 nm) are suspended. In some embodiments, the conductive particles may include silver particles. The conductive ink may be, for example, JET600C or AG806. In particular, as shown in the cross-sectional view of FIG. 1D, the conductive ink 110 may be printed in a 3D manner both on the magnetic material 108 in the cavity 106 as well as outside of the cavity 106. The thickness of the conductive ink 110 may be substantial enough to be able to be printed in the 3D manner without breakage of the electrical connection, for example, between about 15 µm-25 µm. The conductive ink 110 may form traces on the magnetic material. The traces on the magnetic material 108 may be connected to pads formed by the conductive ink 110 printed outside of the cavity 106. The conductive ink 110 may be formed using a Ag base, for example.

Figure 1D:
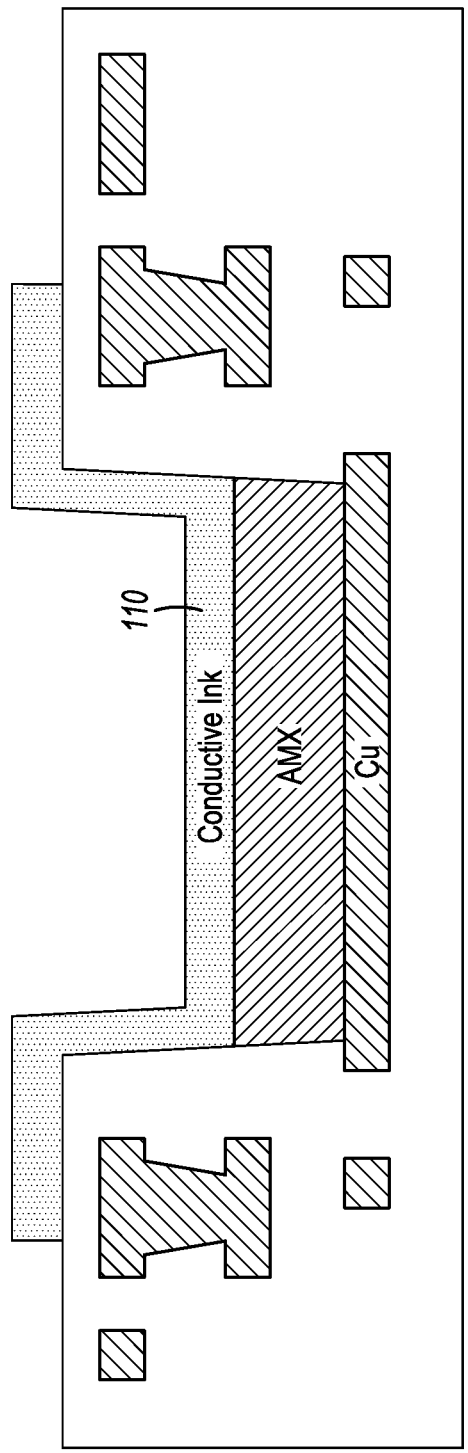
Figure 1E:
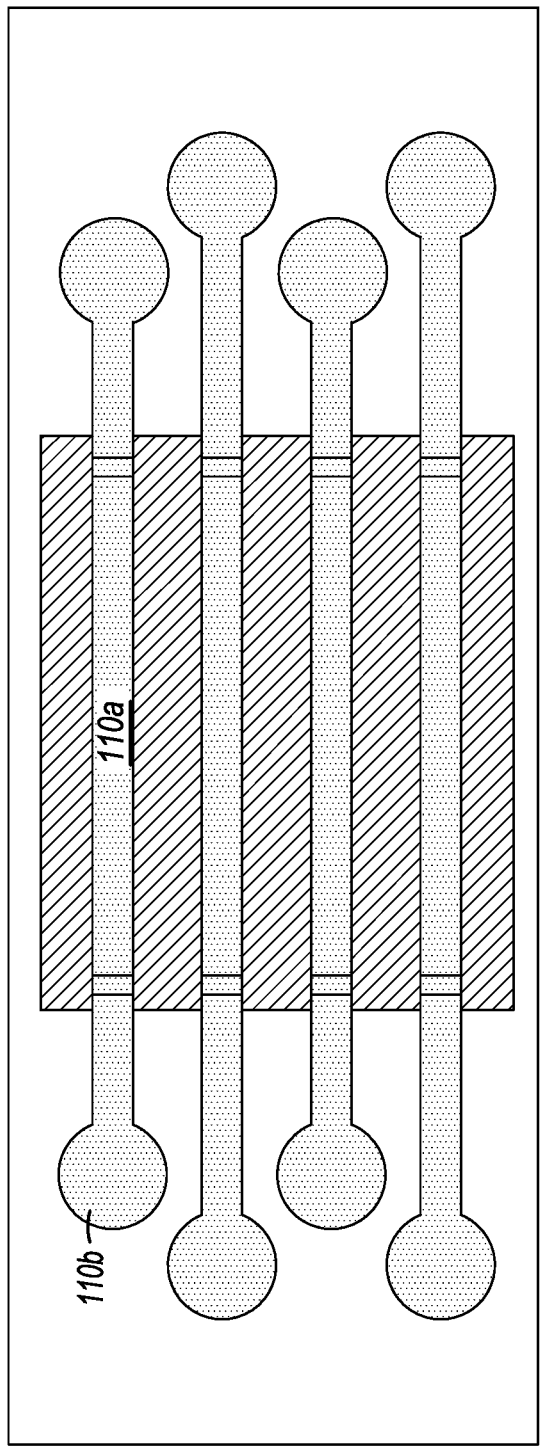

FIG. 1E shows a top view of the cross-sectional view of FIG. 1D showing both the traces 110a formed on the magnetic material 108 as well as the traces and pads 110b printed on the dielectric film 102. As shown in FIG. 1E, multiple separate traces 110a are formed on the magnetic material 108 and each trace 110a is connected to a different pair of pads 110b printed on the dielectric film 102 on opposing sides of the cavity 106. Each trace 110a may have a width, for example, between about 15 µm-50 µm and a length of several mm, for example, up to about 5-10 mm. The length of the trace 110a may be determined to provide a desired amount of inductance when coupled with the magnetic material encasing the trace 110a. The width and thickness of each trace 110a may be dependent on the desired conductivity of the trace 110a. Several passes of the printer may be used to attain the desired thickness and/or width of the trace 110a. The conductive ink 110 may be printed using a micro nozzle at the printer, and the droplet size of the conductive ink 110 can be adjusted by changing the nozzle size. Alternatively, the conductive ink 110 can be printed on the substrate 100 using a screen print.

After printing the conductive ink 110, the conductive ink 110 may be cured or baked at an elevated temperature that does not damage the substrate 100. The substrate 100 containing the conductive ink 110 may be placed into an oven, on a hot plate, exposed to a direct light projector to heat the substrate and/or laser annealed. The length of time used to cure the conductive ink 110 may vary dependent on the temperature and the amount of air flow used, as well as the air humidity. In some embodiments, curing can be performed at about 50-150° C. in an oven for about 5-75 min (or a lower temperature for a hot plate/light source). After curing or baking, the solvent evaporates, and silver particles are left on the substrate to form pattern. Further annealing or sintering may be applied to smooth the interface between the particles. Because of the gap between the particles, the conductivity of conductive ink may be less than that of pure metal.

Figure 1F:
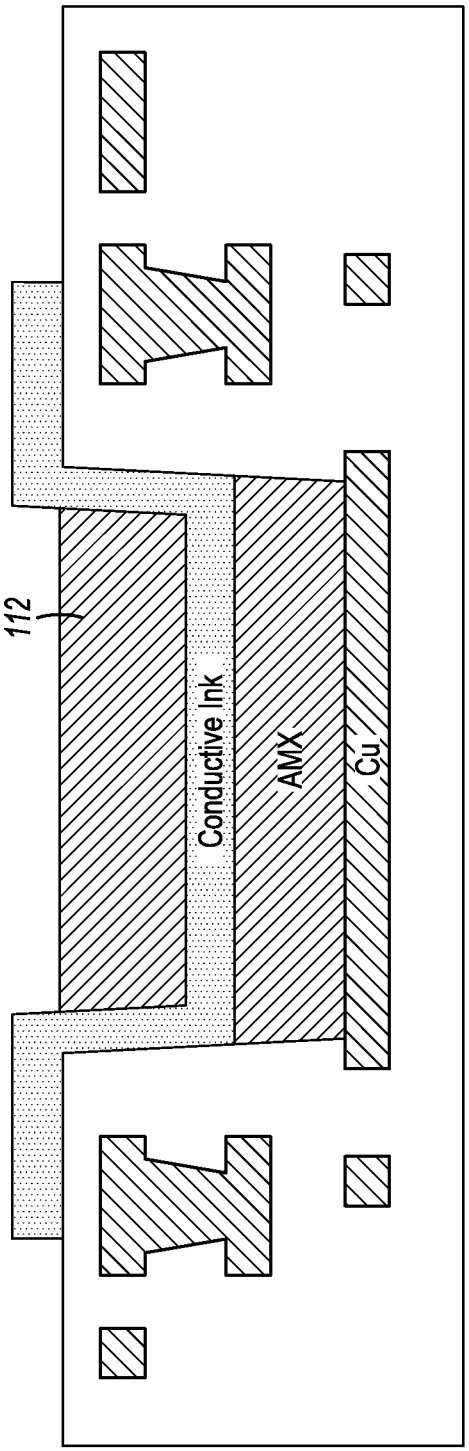
Figure 1I:
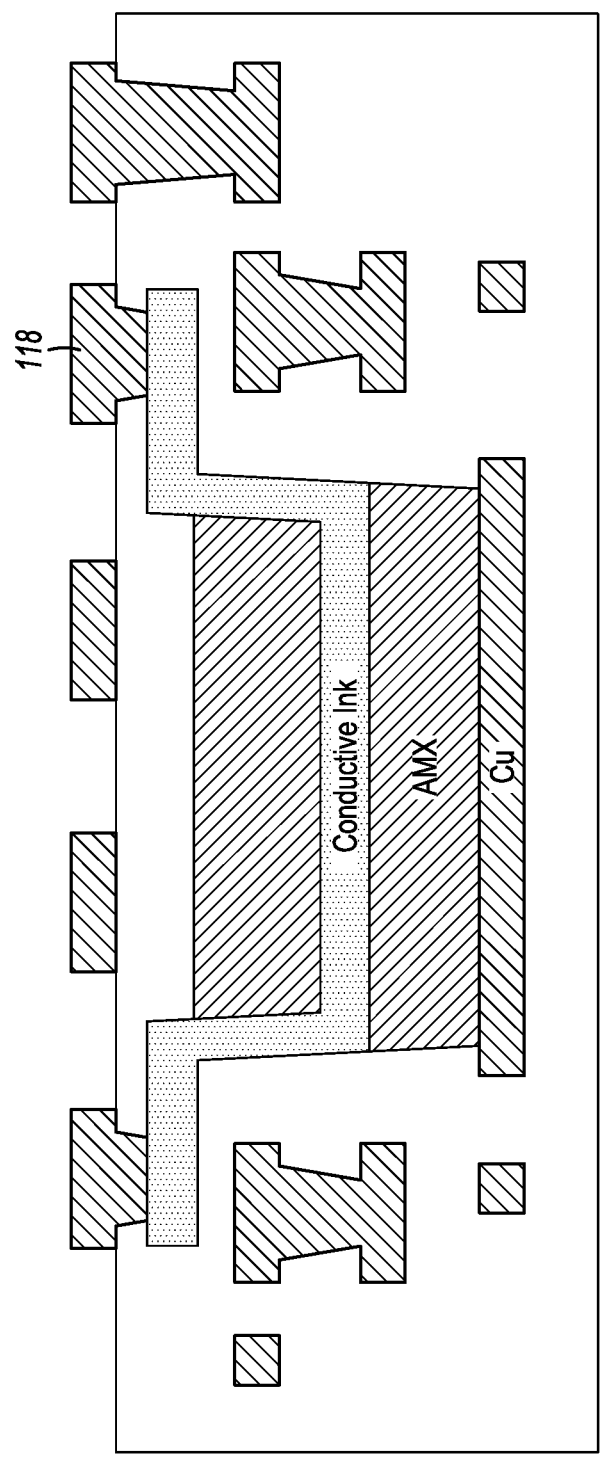

After the conductive ink 110 is printed (and cured) on the magnetic material 108 and the dielectric film 102, another layer of magnetic material 112 may be printed in the cavity 106. The additional magnetic material 112 may be printed to fill the cavity 106, as shown in FIG. 1F, about the remaining 40 nm in the examples above. In some embodiments, the magnetic material layers 108, 112 are symmetric in thickness around the conductive ink 110. The traces 110a in the cavity 106 may thus be encased by (completely surrounded by) the underlying magnetic material 108 and the overlying magnetic material 112. In some embodiments, the underlying magnetic material 108 and the overlying magnetic material 112 may be the same material, while in other embodiments the underlying magnetic material 108 and the overlying magnetic material 112 may be different.

Once the conductive ink 110 is encased by the magnetic material, another dielectric film layer 114 (or other insulating material) may be formed on the structure as shown in FIG. 1G. The dielectric film layer 114 may be used as a protective layer to encapsulate the top magnetic material 112 and traces 110a and pads 110b of the conductive ink 110. The dielectric film layer 114 may subsequently be planarized using chemical-mechanical planarization, for example.

Vias 116 may then be formed in the encapsulating dielectric film layer 114 as shown in FIG. 1H. The vias 116 may be formed using a laser, such as the high-power UV or $CO_2$ laser. When laser etching is used to form the vias 116, a desmear process may be used. Alternatively, a photolithographic process may be used with a wet chemical etch to form the vias 116. In either embodiment, issues with the wet chemical process may be avoided as the magnetic material 112 is isolated from the wet chemical etch by the top dielectric film layer 114.

When laser drilling is used to form the vias 116, the vias 116 may extend to different metal layers. For example, the vias 116 may be formed to provide contact to the pads 110b of the conductive ink 110 and to contact areas of Cu 104 on the N metal layer. The silver-based ink of the pad 110b can act as a laser stopper due to the high reflectivity of the pad 110b, as can the Cu of the N metal layer. At a $CO_2$ wavelength of 9.4 µm, the reflectivity of Ag is higher than that of Cu. This is to say that an Ag-based pad can be a good laser drilling stopper for $CO_2$ lasers. Moreover, Ag of the pad 110b has a relatively high resistance to acid and alkaline solutions, reducing the risk of the silver pad 110b leaching to desmear and/or e-less solutions used to clean the vias 116 as well as later providing a low-resistivity contact to the pads 110b of the conductive ink 110 and to contact areas of Cu 104 on the N metal layer.

A Semi-Additive Process (SAP) may be used to fill the vias 116 as shown in FIG. H. The SAP process may also form contacts on the planarized dielectric film layer 114. The SAP process may form an N+1 layer Cu pattern 118. In some embodiments, the Cu pattern 118 may be separate, so that individual traces 110a on the underlying magnetic material 108 form multiple inductors. In some embodiments, the Cu pattern 118 may connect some or all of the traces 110a on the underlying magnetic material 108 to form one or more inductors.

Figure 1J:
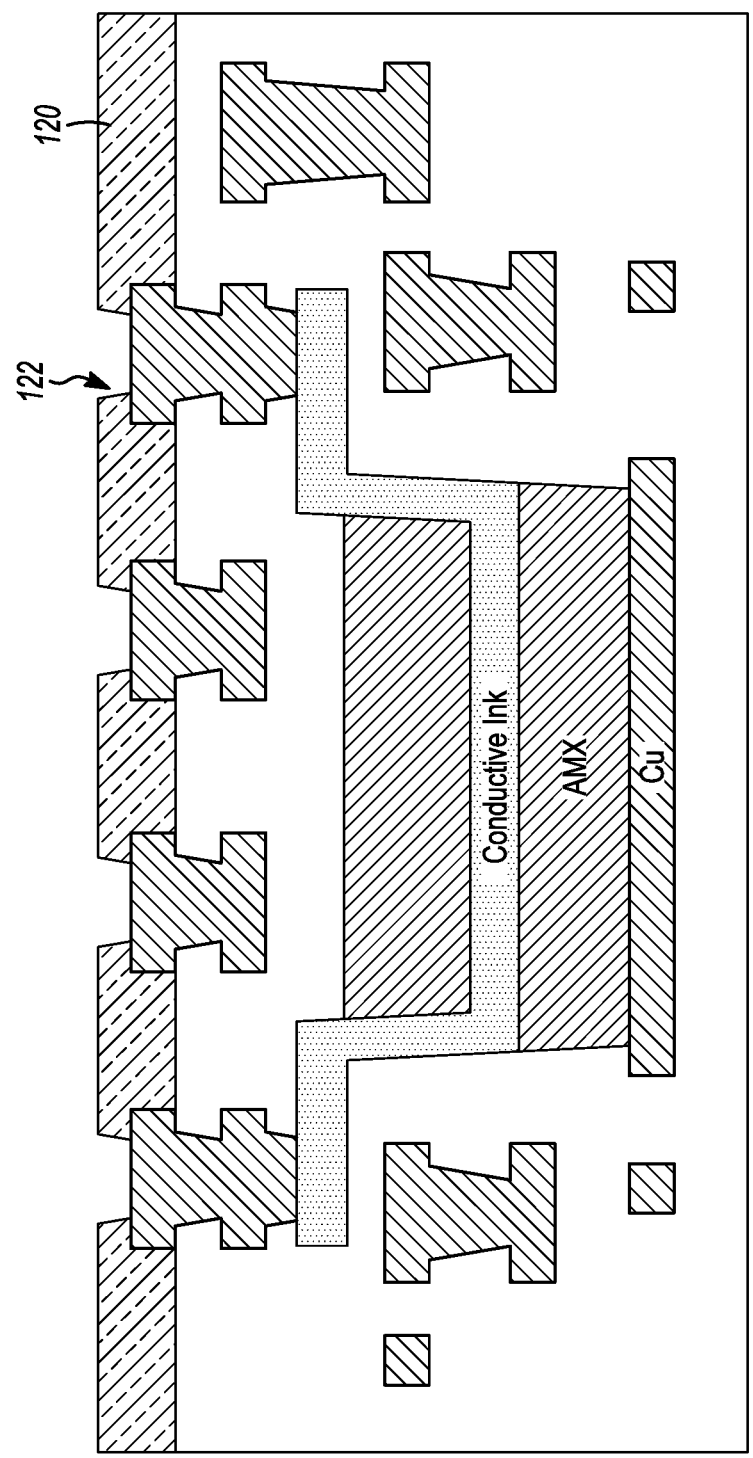

Once the Cu pattern 118 is formed, further SAP processes may be used to fabricate additional dielectric film and metal layers, as well as a solder resist 120 on the overlying structure, as shown in FIG. 1J. Solder resist openings (SROs) 122 may be formed in the solder resist film to enable connection to the Cu pattern 118 and the Cu contacts. Cu bumps, microballs or other conductive materials may be disposed in the SROs 122, depending on the first level interconnect (FLI) requirements to an overlying die, such as a FIVR. As above, the inductors formed by the method shown in FIGS. 1A-1J may be used in circuitry other than a FIVR.

FIGS. 2A-2H illustrate a method of printing conductive ink in accordance with some embodiments. As above, FIGS. 2A-2H primarily show cross-sectional areas of different steps of the method. The circuitry created by the process shown in FIGS. 2A-2H may be used to create an inductor for a FIVR or other circuitry. The processes shown in FIGS. 2A-2H may be similar to that shown in FIGS. 1A-1J.

FIG. 2A illustrates a substrate 200 after processes similar to that of FIGS. 1A-1C. Thus, FIG. 2A shows the substrate 200 after formation of a cavity 206 by laser drilling after a desmear process has been carried out and magnetic material 208 printed in the cavity 206. The substrate 200 contains an insulator (dielectric film layers) 202 and Cu (or other metal) layers 204 deposited and further processed using techniques indicated above. The reflectivity of a stage in the N-2 Cu layer 204 may be used to terminate drilling of the cavity 206 by the high power UV or $CO_2$ laser. The magnetic material 208 may be disposed only within, and fill, the cavity 206. This is unlike the previously shown method, in which the cavity is only partially filled. The top surface of the magnetic material 208 be flattened by a rubber press, or otherwise planarized (using CMP for example), to be essentially level with the surface of the substrate 200.

As shown in the cross-sectional view of FIG. 2B, conductive ink 210 may be printed on the structure. The conductive ink 210 may be contain Ag as a base. As shown, the conductive ink 210 may be printed on the magnetic material 208 and on the topmost dielectric film layer 202. As the magnetic material 208 fills the cavity 206 in this case, the top of the magnetic material 208 may be substantially level with the insulator 202, unlike the conductive ink structure shown in FIG. 1D, the conductive ink 210 may be essentially disposed on a 2D structure.

Figure 2C:
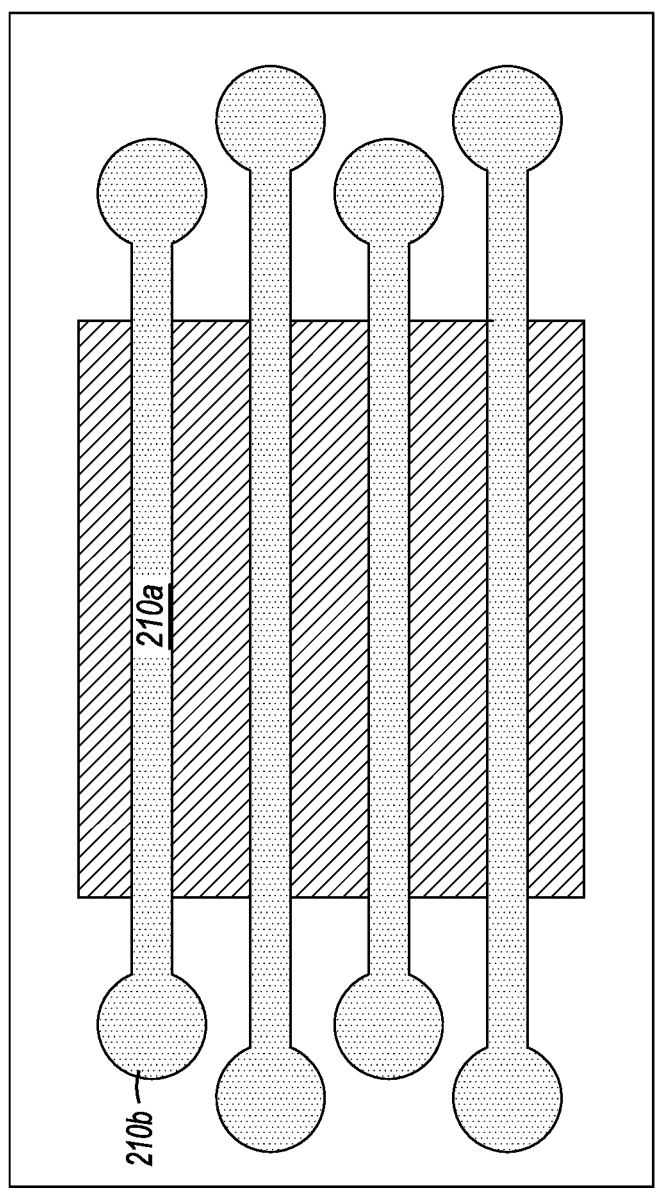

FIG. 2C shows a top view of the structure of FIG. 2B. The conductive ink 210, as in the previous method, may form traces 210a on the magnetic material 208. Each trace 210a on the magnetic material 208 may be connected to pairs of contact pads 210b formed by the conductive ink 210 printed outside of the magnetic material 208 and the cavity 206. The contact pads 210b of a particular trace 210a may be formed on opposite sides of the cavity 206.

Figure 2D:
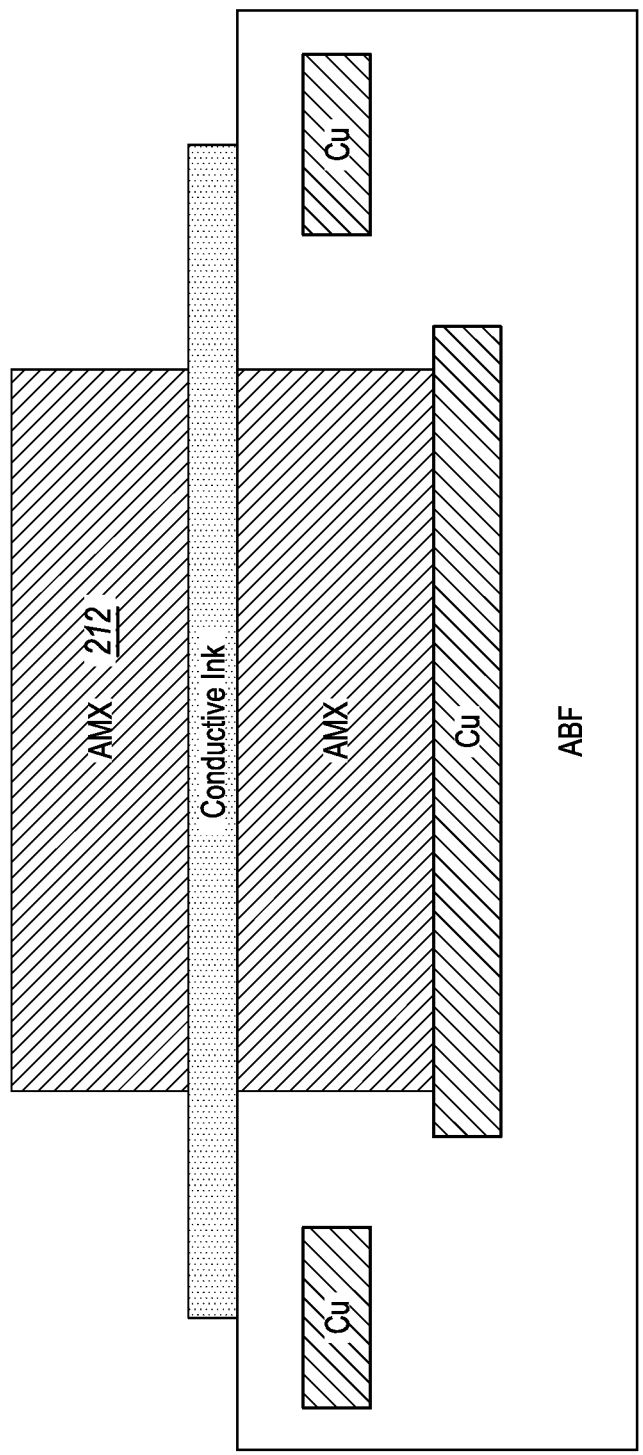

After the conductive ink 210 is printed on the magnetic material 208 in the cavity 206 and the top dielectric film 202, another layer of magnetic material 212 may be printed as shown in FIG. 2D. The additional magnetic material 212 may be limited to overlap only the cavity 206. The traces 210a in the cavity 206 may thus be encased by the underlying magnetic material 208 and the overlying magnetic material 212. The dimensions of the traces 210a may be similar to those above.

Figure 2E:
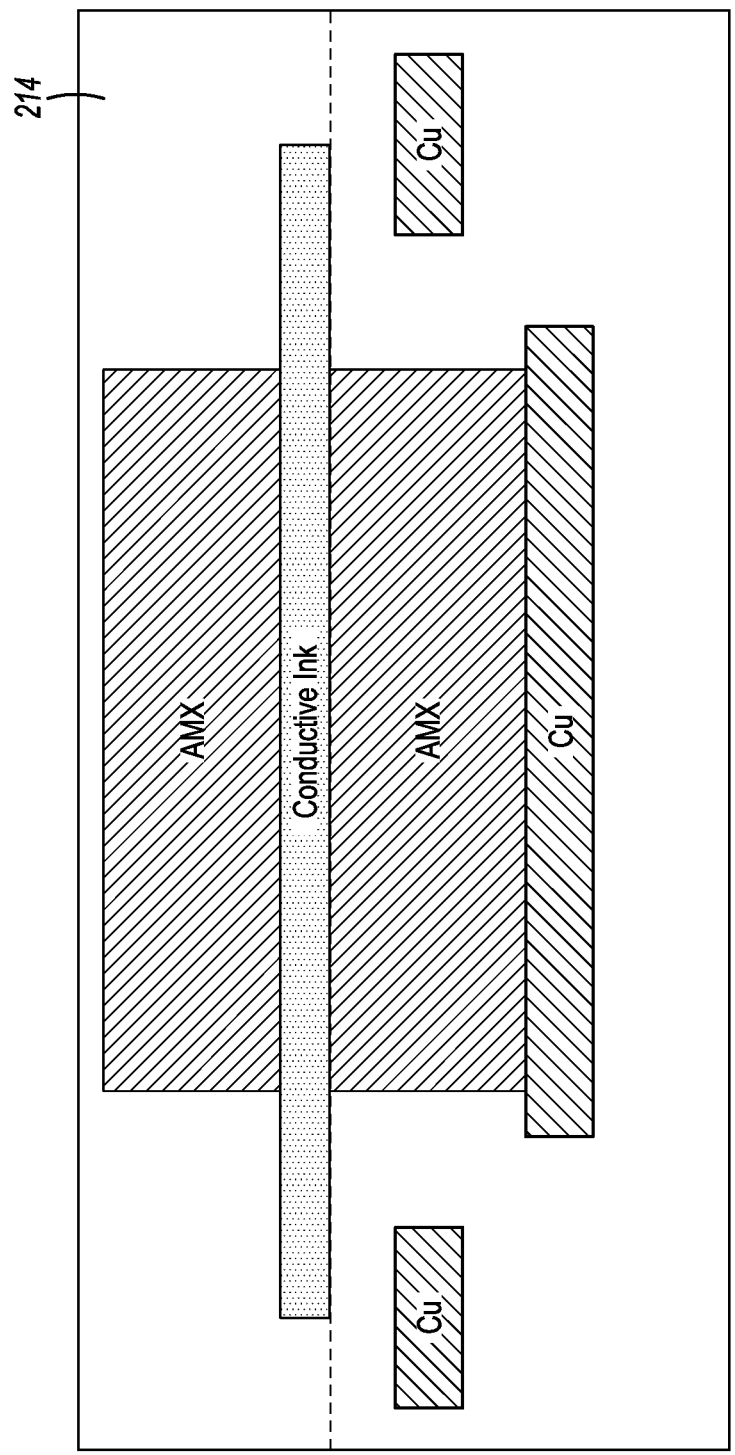

Once the conductive ink 210 over the cavity 206 is encased by the magnetic material 208, 212, another dielectric film layer 214 (or other insulating material) may be formed on the structure for lamination as shown in FIG. 2E. The dielectric film layer 214 may be used to encapsulate the top magnetic material 212 and traces 210a and pads 210b of the conductive ink 210. The dielectric film layer 214 may subsequently be planarized. dielectric film lamination may be used to encapsulate the magnetic material and conductive ink.

Figure 2F:
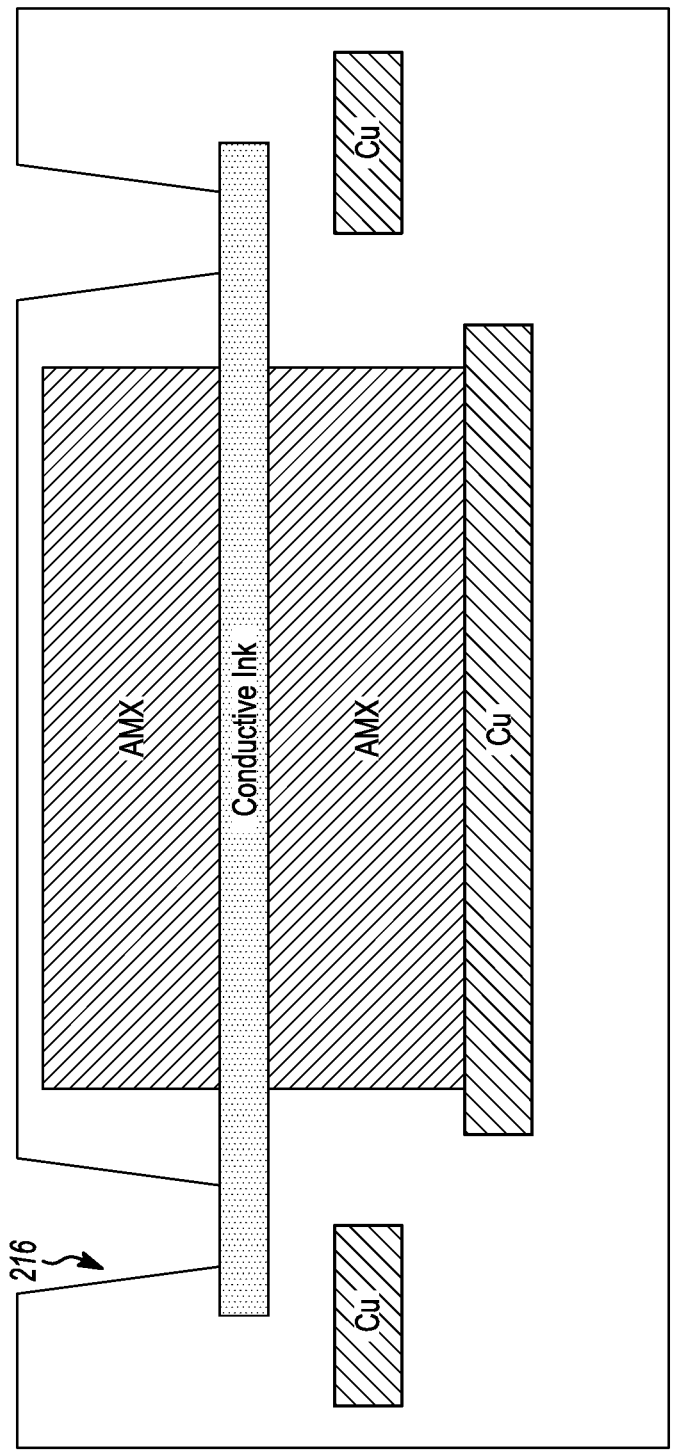

Vias 216 may then be formed in the encapsulating dielectric film layer 214 as shown in FIG. 2F. The vias 216 may be formed using a laser, such as the high-power UV or $CO_2$ laser. A desmear process may be used after forming the vias 216. Alternatively, a photolithographic process may be used with a wet chemical etch to form the vias 216. When laser etching is used to form the vias 216, the vias 216 may extend to different metal layers. For example, the vias 216 may be formed to provide contact to the pads 210b of the conductive ink 210. The silver-based ink of the pad 210b can act as a laser stopper due to the high reflectivity of the pad 210b.

Figure 2G:
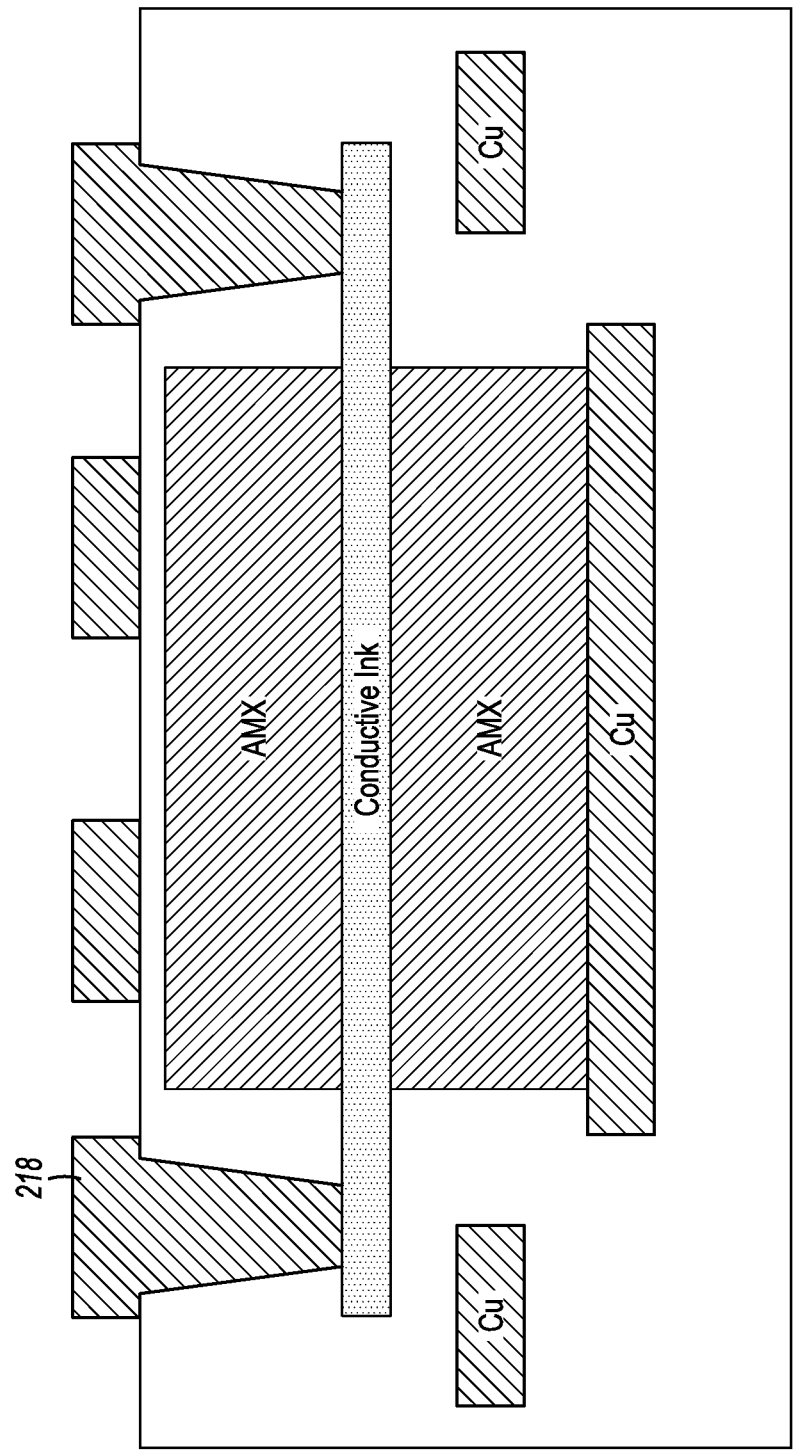

A Semi-Additive Process (SAP) may be used to fill the vias 216 as shown in FIG. 2G. The SAP process may also form contacts 218 on the planarized dielectric film layer 214. As above, the Cu pattern 218 may be disposed such that the traces 210a continue to be isolated and each provide a separate inductor or the Cu pattern 218 may connect some or all of the traces 210a on the underlying magnetic material 208 to form one or more inductors.

Figure 2H:
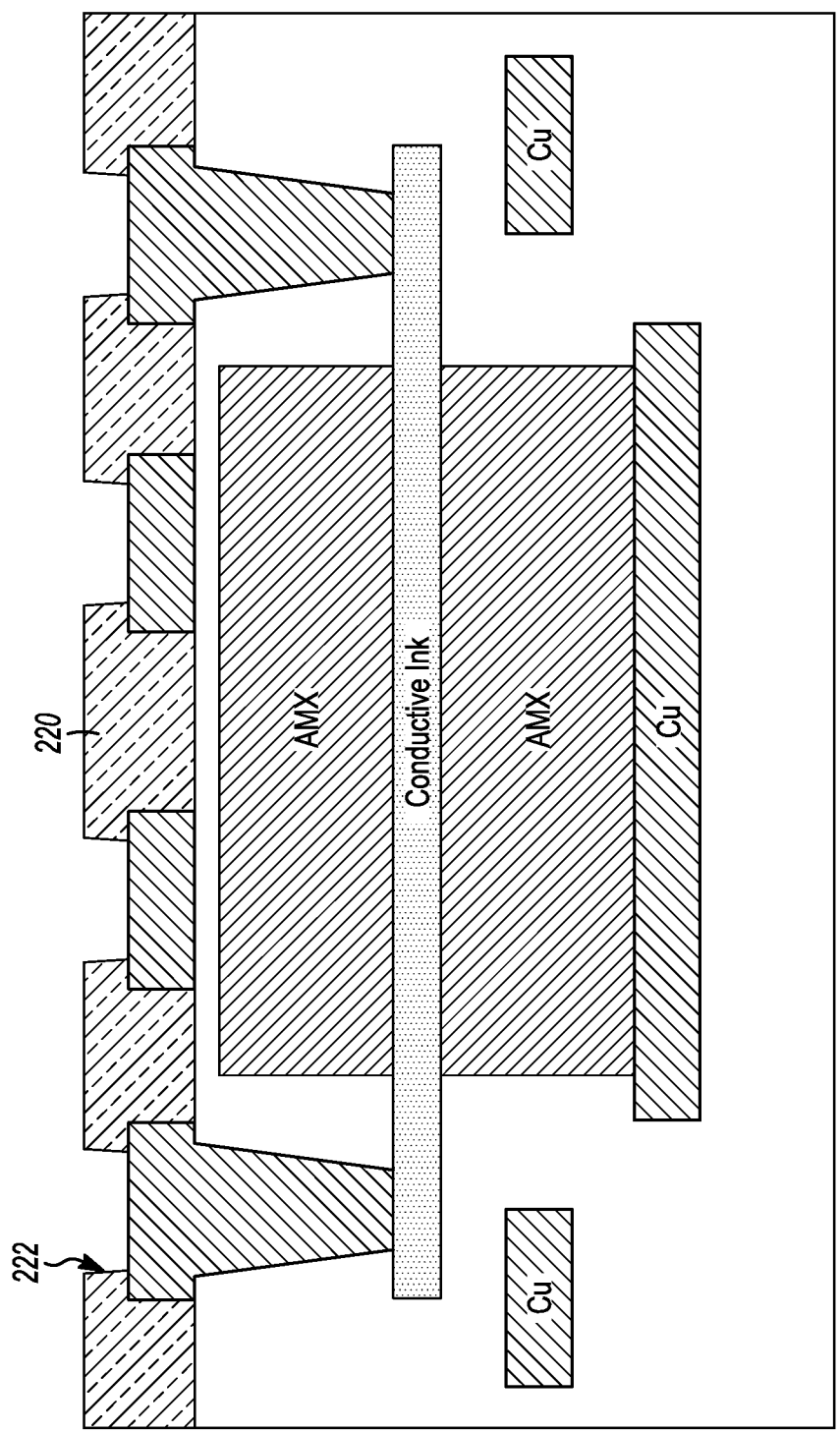

Once the inductor(s) is formed, further photolithographic processes may be used to fabricate additional dielectric film and metal layers, as well as a solder resist on the overlying structure as shown in FIG. 2H. A solder resist film 220 may be deposited on the contacts 218 and SROs 222 may be formed in the solder resist film 220 to enable connection to the Cu pattern and the Cu contacts 218. As above, microballs or Cu bumps (or other conductive materials) may be disposed in the SROs 222, depending on the FLI requirements to enable the structure to be connected to additional circuitry on a separate die.

Although Ag conductive ink is discussed above, other metallic inks may be used. Table 1 shows the DC resistivity of conductive ink (a Ag nanoparticle dispersion-based ink) compared with metallic Cu and Ag. From the table, Ag ink is similar but slightly worse than Cu in resistivity. To compensate for this disparity (i.e., reduce the resistivity to be comparable to Cu), the thickness of the Ag ink may be increased, for example from 25 μmt to 33 μmt. The use of the conductive ink may provide a lower resistance than an air core inductor.

TABLE 1

Resistivity comparison

|  | Resistivity (μΩ cm) |
|---|---|
| Cu | 1.68 |
| Ag | 1.59 |
| Ag ink (736511 ALDRICH) | ~2.2 |

As above, the insulator described in the embodiments may be used in a FIVR. A FIVR may be used to supply regulated power to other components such as power field effect transistors in a package. The FIVR may be formed from a multiphase buck converter with compensation circuitry. In some embodiments, the output from a pulse width modulator (PWM) may be supplied to drivers. The signal from the drivers may control cascode bridges. A DAC word may be supplied to the PWM and to the compensation circuitry. The output from the compensation circuitry may be supplied through the inductor and used as one rail voltage of the cascode bridges.

Figure 3:
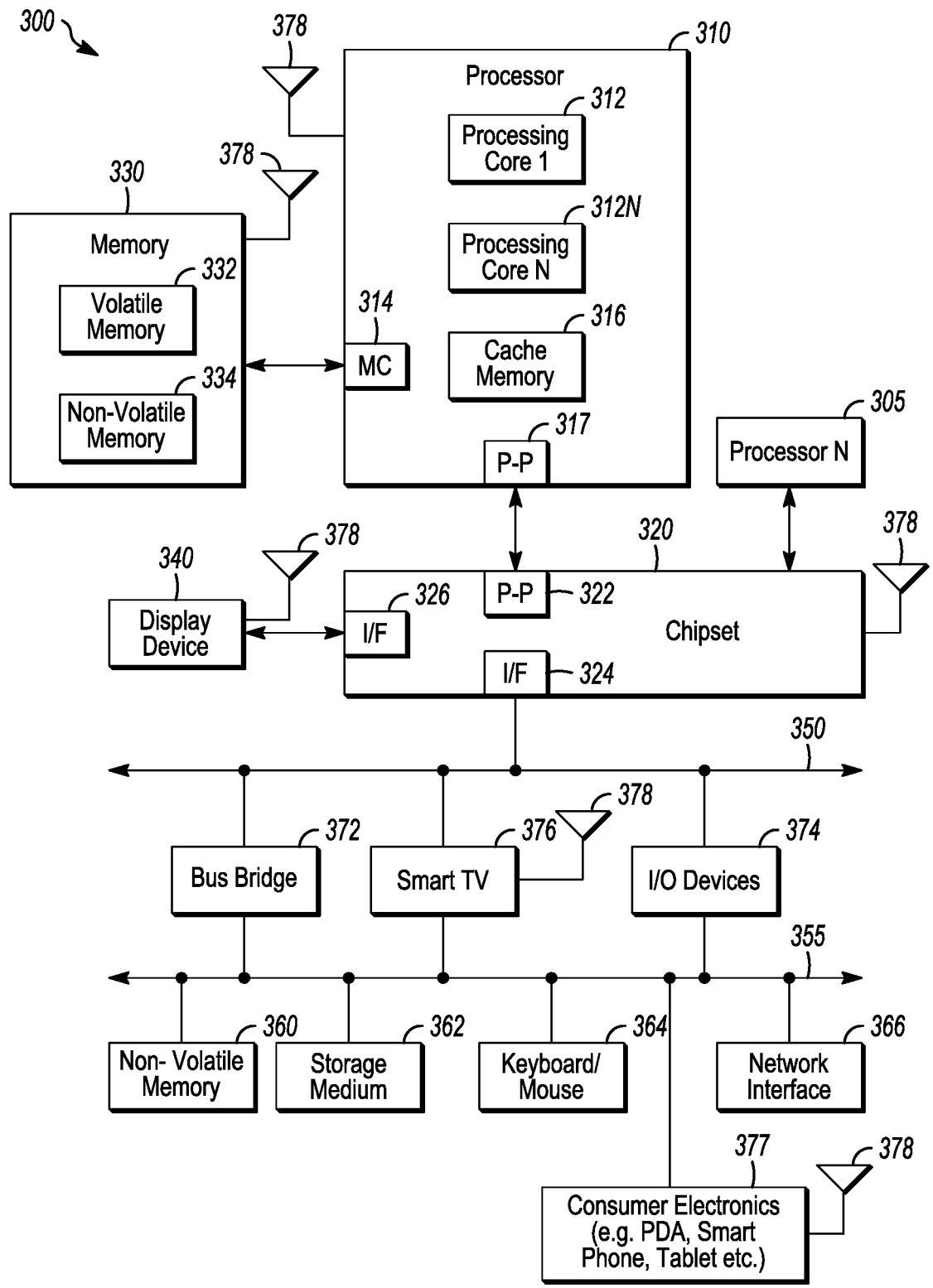
FIG. 3 illustrates a system level diagram of circuitry using the methods described herein.

FIG. 3 illustrates a system level diagram of circuitry using the methods described herein. In one embodiment, system 300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 300 is a system on a chip (SOC) system.

In one embodiment, processor 310 has one or more processor cores 312 and 312N, where 312N represents the Nth processor core inside processor 310 where N is a positive integer. In one embodiment, system 300 includes multiple processors including 310 and 305, where processor 305 has logic similar or identical to the logic of processor 310. In some embodiments, processing core 312 includes, but is not limited to, pre-fetch logic to fetch instructions, decode logic to decode the instructions, execution logic to execute instructions and the like. In some embodiments, processor 310 has a cache memory 316 to cache instructions and/or data for system 300. Cache memory 316 may be organized into a hierarchal structure including one or more levels of cache memory.

In some embodiments, processor 310 includes a memory controller 314, which is operable to perform functions that enable the processor 310 to access and communicate with memory 330 that includes a volatile memory 332 and/or a non-volatile memory 334. In some embodiments, processor 310 is coupled with memory 330 and chipset 320. Processor 310 may also be coupled to a wireless antenna 378 to communicate with any device configured to transmit and/or receive wireless signals. In one embodiment, an interface for wireless antenna 378 operates in accordance with the 3GPP and/or IEEE 302.11 standard protocol, Home Plug AV (HPAV), Ultra Wide Band (UWB), Bluetooth, WiMax, or any form of wireless communication protocol.

In some embodiments, volatile memory 332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 334 includes, but is not limited to, flash memory, phase change memory (PCM), read-only memory (ROM), electrically erasable programmable read-only memory (EEPROM), or any other type of non-volatile memory device.

Memory 330 stores information and instructions to be executed by processor 310. In one embodiment, memory 330 may also store temporary variables or other intermediate information while processor 310 is executing instructions. In the illustrated embodiment, chipset 320 connects with processor 310 via Point-to-Point (PtP or P-P) interfaces 317 and 322. Chipset 320 enables processor 310 to connect to other elements in system 300. In some embodiments of the example system, interfaces 317 and 322 operate in accordance with a PtP communication protocol such as the Intel® QuickPath Interconnect (QPI) or the like. In other embodiments, a different interconnect may be used.

In some embodiments, chipset 320 is operable to communicate with processor 310, 305N, display device 340, and other devices, including a bus bridge 372, a smart TV 376, I/O devices 374, nonvolatile memory 360, a storage medium (such as one or more mass storage devices) 362, a keyboard/mouse 364, a network interface 366, and various forms of consumer electronics 377 (such as a PDA, smart phone, tablet etc.), etc. In one embodiment, chipset 320 couples with these devices through an interface 324. Chipset 320 may also be coupled to a wireless antenna 378 to communicate with any device configured to transmit and/or receive wireless signals.

Chipset 320 connects to display device 340 via interface 326. Display 340 may be, for example, a liquid crystal display (LCD), a light emitting diode (LED) array, an organic light emitting diode (OLED) array, or any other form of visual display device. In some embodiments of the example system, processor 310 and chipset 320 are merged into a single SOC. In addition, chipset 320 connects to one or more buses 350 and 355 that interconnect various system elements, such as I/O devices 374, nonvolatile memory 360, storage medium 362, a keyboard/mouse 364, and network interface 366. Buses 350 and 355 may be interconnected together via a bus bridge 372.

In one embodiment, mass storage device 362 includes, but is not limited to, a solid state drive, a hard disk drive, a universal serial bus flash memory drive, or any other form of computer data storage medium. In one embodiment, network interface 366 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the 3GPP standard and its related family, the IEEE 802.11 standard and its related family, Home Plug AV (HPAV), Ultra Wide Band (UWB), Bluetooth, WiMax, or any form of wireless communication protocol.

While the modules shown in FIG. 3 are depicted as separate blocks within the system 300, the functions performed by some of these blocks may be integrated within a single semiconductor circuit or may be implemented using two or more separate integrated circuits. For example, although cache memory 316 is depicted as a separate block within processor 310, cache memory 316 (or selected aspects of 316) can be incorporated into processor core 312.

ADDITIONAL NOTES AND EXAMPLES

Example 1 is a method of forming an inductor, the method comprising: forming a cavity in an insulator on a substrate; printing, using a printer or screen print, a layer of magnetic material in the cavity; printing, using the printer or screen print, a conductive ink on the magnetic material; and printing, using the printer or screen print, another layer of the magnetic material on the conductive ink to encase the conductive ink in the magnetic material and form an inductor without using a wet chemical process.

In Example 2, the subject matter of Example 1 includes, depositing a protective layer on the conductive ink and the other layer of magnetic material; forming an inductor cavity in the protective layer to contact the conductive ink; and forming inductor contacts in the inductor cavity to electrically connect the conductive ink to a surface of the protective layer.

In Example 3, the subject matter of Example 2 includes, wherein: the cavity and the inductor cavity are formed by a laser, and the method further comprises desmearing the cavity and the inductor cavity after formation, the magnetic material protected by the protective layer from a wet chemical process used during the desmearing.

In Example 4, the subject matter of Example 3 includes, wherein: formation of the cavity is terminated by reflectivity of a metal layer buried in the substrate under the insulator.

In Example 5, the subject matter of Examples 3-4 includes, wherein: formation of the inductor cavity is terminated by reflectivity of the conductive ink.

In Example 6, the subject matter of Examples 2-5 includes, wherein: the other layer of magnetic material is disposed within the cavity, and the conductive ink is disposed within the cavity and is in contact with a top surface of the insulator adjacent to sides of the cavity.

In Example 7, the subject matter of Examples 2-6 includes, wherein: the layer of magnetic material fills the cavity, and the conductive ink and the other layer of magnetic material are disposed above a surface of the insulator.

In Example 8, the subject matter of Examples 2-7 includes, wherein: the conductive ink comprises a trace disposed on the layer of magnetic material and pads disposed on the insulator at opposite ends of the trace, and the insulator contacts contact the pads.

In Example 9, the subject matter of Examples 2-8 includes, depositing an insulating layer and solder resist on the inductor contacts, forming cavities each of the insulating layer and solder resist, and connecting to the inductor contacts through metal deposited in the cavities in the insulating layer and solder resist.

In Example 10, the subject matter of Examples 1-9 includes, wherein: the substrate is a coreless substrate.

In Example 11, the subject matter of Examples 1-10 includes, wherein: the conductive ink comprises an Ag ink having a resistivity comparable to Cu.

Example 12 is an inductor comprising: a substrate comprising multiple insulating and conductive layers; a cavity formed in a plurality of the insulating layers; a first magnetic material layer in the cavity; a conductive ink on the first magnetic material layer; a second magnetic material layer on the conductive ink; and inductor contacts to the conductive ink to contact the inductor.

In Example 13, the subject matter of Example 12 includes, a protective layer on the conductive ink and the second magnetic material layer; and an inductor cavity in the protective layer to contact the conductive ink; wherein the inductor contacts are disposed in the inductor cavity electrically connect the conductive ink to a surface of the protective layer.

In Example 14, the subject matter of Example 13 includes, wherein: the second magnetic material is protected by the protective layer from a wet chemical process used during desmearing of the inductor cavity.

In Example 15, the subject matter of Examples 13-14 includes, wherein: the second magnetic material layer is disposed within the cavity, and the conductive ink is disposed within the cavity and is in contact with a top surface of a topmost insulating layer of the plurality of insulating layers adjacent to sides of the cavity.

In Example 16, the subject matter of Examples 13-15 includes, wherein: the first magnetic material layer fills the cavity, and the conductive ink and the other layer of magnetic material are disposed above a surface of a topmost insulating layer of the plurality of insulating layers.

In Example 17, the subject matter of Examples 13-16 includes, wherein: the conductive ink comprises a trace disposed on the first magnetic material layer and pads disposed at opposite ends of the trace on a topmost insulating layer of the plurality of insulating layers, and the insulator contacts contact the pads.

In Example 18, the subject matter of Examples 12-17 includes, wherein: the conductive ink comprises an Ag ink having a resistivity comparable to Cu.

Example 19 is a Fully Integrated Voltage Regulator (FIVR), the FIVR comprising: a plurality of transistors; and an inductor connected with each transistor, the inductor comprising: a substrate comprising an insulator; a cavity formed in the insulator; a first magnetic material layer in the cavity; an Ag conductive ink on the first magnetic material layer; a second magnetic material layer on the conductive ink; and inductor contacts to the conductive ink to contact the inductor.

In Example 20, the subject matter of Example 19 includes, wherein the inductor further comprises: a protective layer on the conductive ink and the second magnetic material layer; and an inductor cavity in the protective layer to contact the conductive ink; wherein the inductor contacts are disposed in the inductor cavity electrically connect the conductive ink to a surface of the protective layer.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The invention claimed is:

1. A method of forming an inductor, the method comprising:
    forming a cavity in an insulator on a substrate;
    printing, using a printer or screen print, a layer of magnetic material in the cavity;
    printing, using the printer or screen print, a conductive ink on the magnetic material; and
    printing, using the printer or screen print, another layer of the magnetic material on the conductive ink to encase the conductive ink in the magnetic material and form an inductor without using a wet chemical process.

2. The method of claim 1, further comprising:
    depositing a protective layer on the conductive ink and the other layer of magnetic material;
    forming an inductor cavity in the protective layer to contact the conductive ink; and
    forming inductor contacts in the inductor cavity to electrically connect the conductive ink to a surface of the protective layer.

3. The method of claim 2, wherein:
    the cavity and the inductor cavity are formed by a laser, and
    the method further comprises desmearing the cavity and the inductor cavity after formation, the magnetic material protected by the protective layer from a wet chemical process used during the desmearing.

4. The method of claim 3, wherein:
    formation of the cavity is terminated by reflectivity of a metal layer buried in the substrate under the insulator.

5. The method of claim 3, wherein:
    formation of the inductor cavity is terminated by reflectivity of the conductive ink.

6. The method of claim 2, wherein:
    the other layer of magnetic material is disposed within the cavity, and
    the conductive ink is disposed within the cavity and is in contact with a top surface of the insulator adjacent to sides of the cavity.

7. The method of claim 2, wherein:
    the layer of magnetic material fills the cavity, and
    the conductive ink and the other layer of magnetic material are disposed above a surface of the insulator.

8. The method of claim 2, wherein:
    the conductive ink comprises a trace disposed on the layer of magnetic material and pads disposed on the insulator at opposite ends of the trace, and
    the insulator contacts contact the pads.

9. The method of claim 2, further comprising:
    depositing an insulating layer and solder resist on the inductor contacts,
    forming cavities each of the insulating layer and solder resist, and
    connecting to the inductor contacts through metal deposited in the cavities in the insulating layer and solder resist.

10. The method of claim 1, wherein:
    the substrate is a coreless substrate.

11. The method of claim 1, wherein:
    the conductive ink comprises an Ag ink having a resistivity comparable to Cu.

* * * * *